United States Patent [19]
Davis

[11] Patent Number: 5,523,580
[45] Date of Patent: Jun. 4, 1996

[54] RETICLE HAVING A NUMBER OF SUBFIELDS

[75] Inventor: Donald E. Davis, Poughkeepsie, N.Y.

[73] Assignee: International Business Machines Corporation, Armonk, N.Y.

[21] Appl. No.: 173,315

[22] Filed: Dec. 23, 1993

[51] Int. Cl.⁶ .................................................. H01J 37/09
[52] U.S. Cl. .............................. 250/505.1; 250/492.22; 250/492.23; 430/5
[58] Field of Search ........................ 250/492.23, 492.22, 250/492.2, 505; 430/5

[56] References Cited

U.S. PATENT DOCUMENTS

| | | | |
|---|---|---|---|
| 4,140,913 | 2/1979 | Anger et al. | 250/492 A |
| 4,243,866 | 1/1981 | Pfeiffer et al. | 219/121 EK |
| 4,376,249 | 3/1983 | Pfeiffer et al. | 250/396 ML |
| 4,544,846 | 10/1985 | Langner et al. | 250/396 ML |
| 4,577,111 | 3/1986 | Saitou et al. | 250/492.2 |
| 4,902,899 | 2/1990 | Lin et al. | 250/492.2 |
| 5,036,209 | 7/1991 | Kataoka et al. | 250/492.2 |
| 5,105,089 | 4/1992 | Yamada | 250/492.2 |
| 5,364,718 | 11/1994 | Oae et al. | 430/5 |

OTHER PUBLICATIONS

Bohlen et al., "High Throughput Submicron Lithography with Electron Beam Proximity Printing", Solid State Technology, Sep. 1984, pp. 210–217.

Berger et al., "New approach to projection–electron lithography with demonstrated 0.1 μm linewidth", Appl. Phys. Lett. 57(2), 9 Jul. 1990, pp. 153–155.

Liddle et al., "Mask fabrication for projection electron–beam lithography incorporating the Scalpel technique", J. Vac. Sci. Technol.B, 9 (6), Nov./Dec. 1991, pp. 3000–3004.

Berger et al., "Projection electron–beam lithography: A new approach", J. Vac. Sci. Technol.B, vol. 9, No. 6, Nov./Dec. 1991, pp. 2996–2999.

*Primary Examiner*—Jack I. Berman

[57] ABSTRACT

A reticle for an electron beam system for direct writing applications has a base layer that contains a reticle pattern; a set of reinforcing struts connected to the base layer separating the base layer into a set of non-contiguous subfields; in which the pattern is carried by a set of apertures areas in said base layer; and in which the set of non-contiguous subfields has overlapping rim portions in which the overlap portions of corresponding lines have a pattern that produces the correct exposure when the subfields are correctly aligned and minimizes pattern feature discontinuities when the subfields are misaligned. A corresponding method consists of overlapping the reticle at the field or subfield boundaries and forming a spatial breakup or a partially transmissive area of the pattern elements contained in the overlapped areas, preventing shorts and open failures in the lines or pattern elements and providing additional tolerance for the alignment of the adjacent fields or subfields.

6 Claims, 5 Drawing Sheets

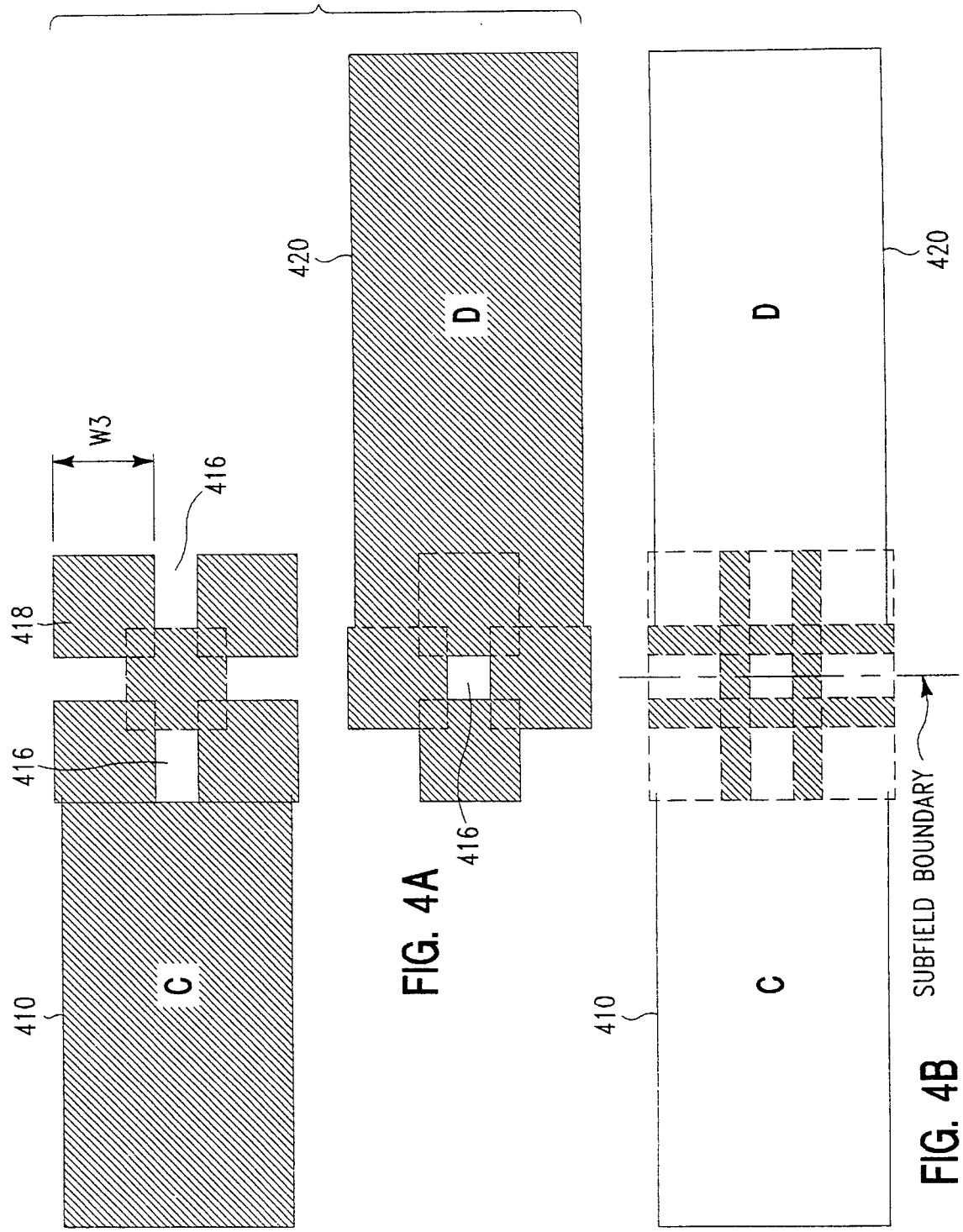

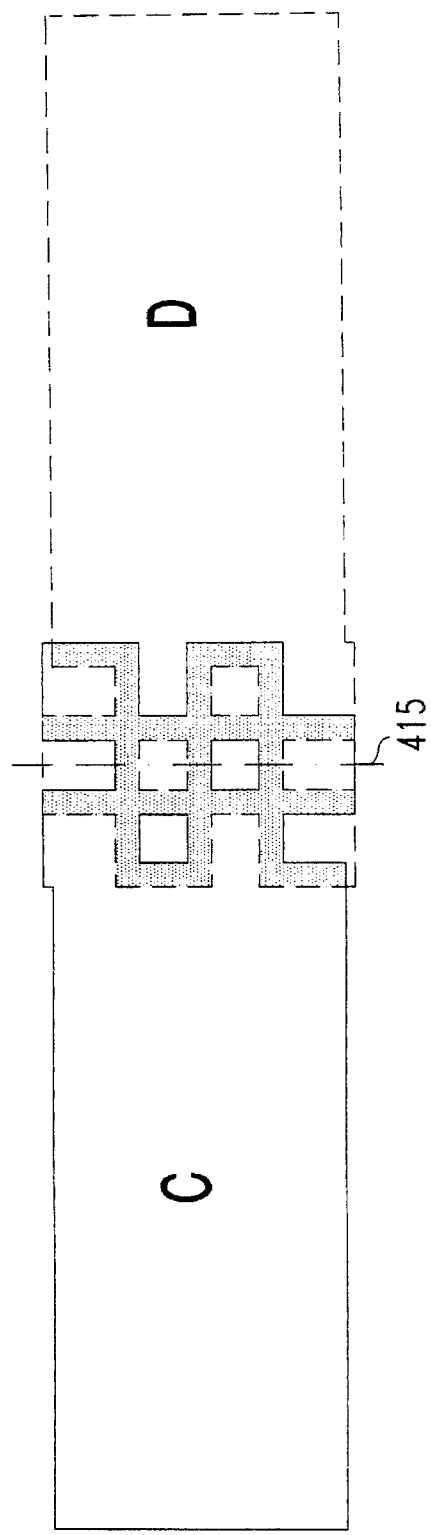

RETICLE HAVING A NUMBER OF SUBFIELDS

TECHNICAL FIELD

The field of the invention is that of reticles used for forming patterns on an integrated circuit wafer, including the field of reticles suitable for use in electron beam systems.

BACKGROUND ART

In systems that combine or stitch together on the wafer a set of small subfields on the reticle, as described in S. D. Berger & J. M. Gibson, APPL. PHYS. LETTERS 57 (2) (1990) 153), there is the problem of joining up corresponding lines or pattern features on adjacent subfields. This stitching problem also exists in any lithographic system wherever fields or subfields are butted and the features that span the fields or subfields are stitched together. Imperfect stitching of features can result in short or open circuits which will cause hard failures in the integrated circuit being formed. Also, if an overlap is exposed at full strength, the extra intensity will raise portions of the resist outside the intended area above threshold, causing "blooming" in which the feature being defined has a greater size than intended. The prior art of electron-beam direct writing exposures has used a technique called grey splicing in which corresponding features are overlapped and exposed at ½ dose at the boundary with half the exposure of the main area.

Consequently, the art has sought a reticle for stitching that would offer an acceptable tradeoff between ensuring correct alignment and mask complexity.

SUMMARY OF THE INVENTION

The invention relates to a reticle having, for example, a set of non-contiguous subfields which may have overlapping rim portions in which the overlap portions of corresponding features have a pattern that produces the correct exposure when the subfields are correctly aligned and minimizes pattern feature discontinuities when the subfields are misaligned.

BRIEF DESCRIPTION OF THE DRAWINGS

FIGS. 3, 4, and 5 illustrate details of the application of the invention.

BEST MODE OF CARRYING OUT THE INVENTION

Figure 1:
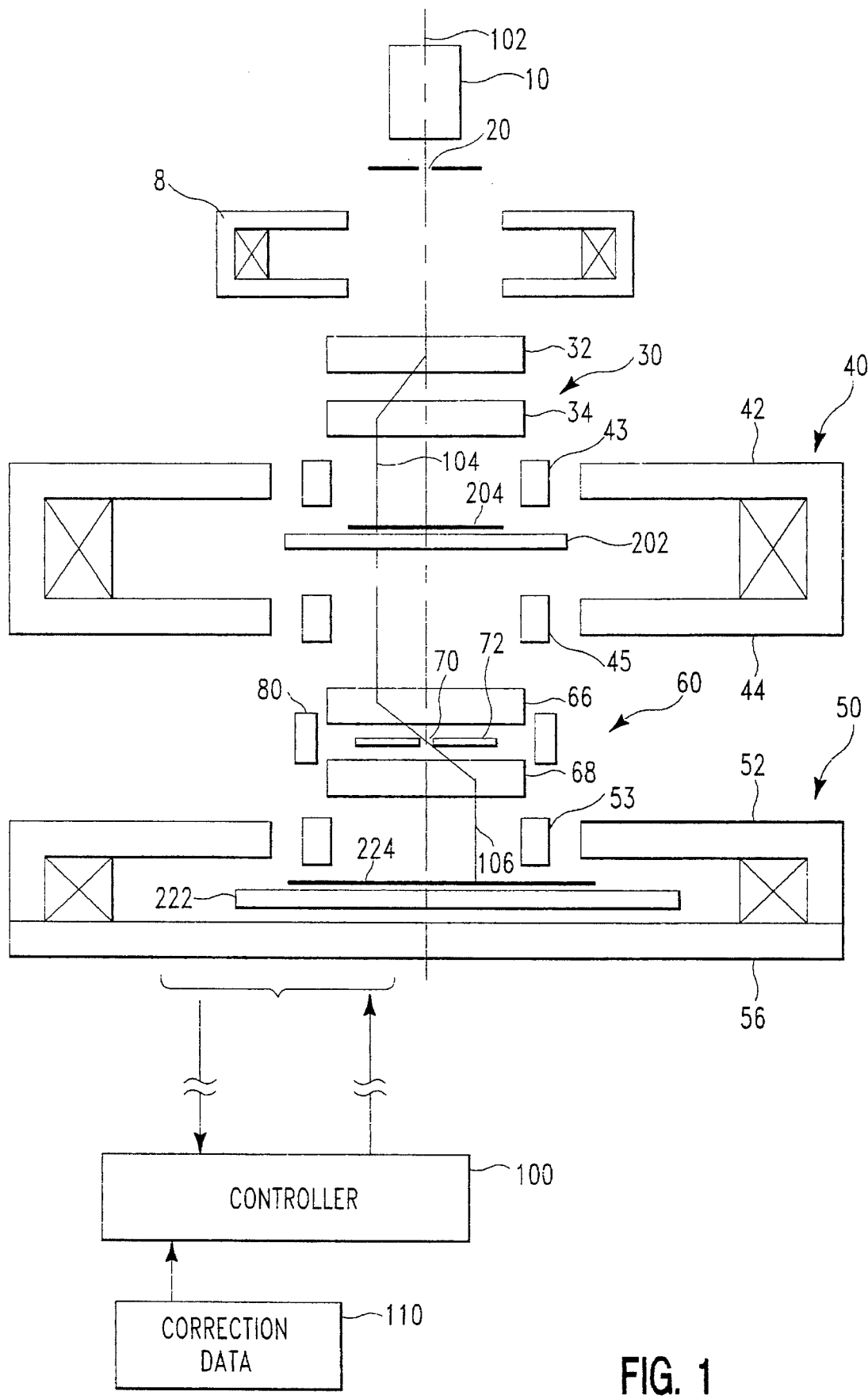
FIG. 1 illustrates in partially pictorial, partially schematic style, an e-beam system for use with the invention.

FIG. 1, shows in partially pictorial, partially schematic form, an electron beam system employing an embodiment of the invention. At the top of the drawing, electron gun source 10 emits a diverging beam of electrons at a nominal energy of 100 kev downwardly in the Z direction along system axis 102 through illuminating aperture 20, having a nominal dimension of 1 mm square in this example. The aperture size is chosen so that the electron distribution across this aperture is uniform within limits such that the intensity variation across the subfield on the wafer is acceptable.

In order to accommodate the system demand for a very large field, the beam will be scanned in steps sequentially across the surface of reticle 204. The beam is deflected by conventional deflection means 32 and 34 which have the capability to deflect the beam orthogonally to the Z-axis in the X direction (left and right in the drawing) and/or in the Y direction (in and out of the plane of the paper). The beam extends downward along second axis 104, (for convenience, the beam axis at the nth subfield of the reticle will be referred to as the "reticle axis"), through a first variable axis lens denoted generally by the numeral 40 and having upper and lower pole pieces 42 and 44. Axis shifting yokes 43 and 45 (referred to generally as axis-shifting means) superimpose their fields over the lens fields generated between the pole pieces 42 and 44 so that the combined fields are azimuthally symmetric about axis 104 in a region larger than the beam, as is taught in U.S. Pat. No. 4,376,249. With this arrangement, off-axis aberrations introduced by the lens are substantially reduced, thereby permitting the use of a large scan field that may exceed 10 mm. Lenses of this type are referred to as variable axis lenses (VAL), since the optical axis of the lens is controllably shifted. The use of variable axis lenses provides high resolution electronic scanning of the reticle and wafer areas, which is complemented by mechanical scanning of the reticle and wafer as required to cover the entire chip real estate.

Beam 104 is focused onto reticle 204 by the upper part of lens 40, thereby creating an image of aperture 20 on the reticle coincident in size with a reticle subfield. Beam 104 strikes the nth subfield of the reticle 204 and passes along the Z axis through the bore of pole piece 44. As it passes through the reticle, the beam is patterned with the information contained in the subfield. In the case of a conventional absorbing reticle, the beam will be essentially absorbed in thick opaque areas and pass undisturbed through open areas. Ring-shaped ("doughnut") patterns are sequentially exposed in super-position of complementary reticles to compose the desired features as described in H. Bohlen et al., Solid state technol., September (1984)).

The lower portion of lens 40 again collimates the beam in this example and, together with deflector 66, directs the beam to contrast aperture 70 that performs several functions as described below. Preferably the beam is collimated in the space between lens 40 and lens 50, in order to reduce interactions between the electrons. Collimation is not required and the term "operating on" the beam will be used to cover collimating, focusing and defocusing. The lower part of lens 40 in conjunction with the preceding lenses including the upper portion of lens 40 focuses an image of source 10 on aperture 70 as well as collimating the image of the reticle. Those skilled in the art will readily understand the constraints or element position and focal length imposed by this requirement.

It is an advantageous feature of the invention that the image of a subfield on the wafer may be translated from the position where a full-chip projection system would place it. Thus, the subfields of the reticle can be projected by the system onto the wafer essentially independently of each other. Consequently, the requirements to be placed on the reticle regarding accuracy and stability can be drastically reduced, as the system can provide small corrections for the position of each subfield before and even during exposure. Additionally, the reticle can have pre-distorted features that compensate for any remaining distortion in the electron optics. Furthermore, the capability of applying corrections on a subfield basis (a key advantage of probe-forming systems) eliminates the need for the reticle pattern to be contiguous over the entire chip area. Consequently, a stronger reticle can be used in which the subfields are physically separated and reinforcing struts are used to support the reticle and to resist the distorting effects of the heat absorbed by the reticle such as that illustrated in S. D. Berger et al., J. Vac. Sci. & Technol. B 9 (6)(1991) 2996; or in J. A. Liddle et al., Ibid., P. 3000). The subfields on the wafer are adjusted in position in the X-Y plane so that they are contiguous, using the stitching capability of the system. This stitching will not be perfect, of course, and such a separated-subfield system has an inherent problem of joining up the images of adjacent subfields on the wafer.

Deflectors 66 and 68 perform a translation inverse to that done above reticle 204 to bring beam 104 back to system axis 102 at aperture 70 and then to bend the beam to final beam 106 (for convenience, the beam axis at the nth subfield image on the wafer will be referred to as the "wafer axis"), travelling parallel to axis 102 and on the opposite side from beam 104. The point at which the beam crosses axis 102 will be referred to as the pivot point because the beam pivots through that point as it images various subfields. Variable axis immersion lens (VAIL) 50 together with the lower half of variable axis lens 40 focuses beam 106 on to wafer 224, generating a demagnified image on the wafer of the pattern contained in the reticle subfield. Lens 50 is a particular form of VAIL in which a magnetically permeable plate 56 below wafer 224 provides a return path for the magnetic fields that focus the beam on wafer 224. In general, a VAIL can permit the beam to pass through. Lens 40 is also a VAIL, since reticle 204 is immersed in the field. It may be referred to either as a "dual" VAIL since it performs two focusing actions—one to focus a collimated beam on to reticle 204 and another to collimate the beam emerging from reticle 204, or it may be referred to as a "transmissive" VAIL, since it transmits the beam to the next element instead of stopping it.

The axis crossover makes possible some advantageous features of the invention. One skilled in the art would think that, having reduced off-axis aberrations with axis-shifting yokes 43 and 45, it would be sufficient to continue beam axis 104 all the way down to wafer 224, with only a minor correction in displacement to stitch together the subfields on the wafer. The addition of any elements invariably introduces aberration, since no element is perfect. Thus, one skilled in the art would prefer to have only a single offset axis and to avoid the use of additional elements such deflectors 66 and 68. The addition of deflectors 66 and 68 and the deflection through the pivot point, however, effectively decouples the two lens systems 40 and 50 from each other, so that each can have its own optical axis independently, with the beam staying on these respective variable axes.

A first advantage of this independence is that the beam can be steered at all times through one fixed pivot point on the symmetry axis 102 of the lens system at a location that can be chosen at will. Thus, there can be a single multi-purpose aperture 70 on the pivot point, instead of one aperture for each subfield. If the beam stayed on the same side of the system axis, an aperture plate containing one opening for each subfield would be required. This would not be practical because extremely stringent requirements for accuracy and stability comparable to those imposed on X-ray masks would have to be placed on such a multi-hole aperture plate under continuous high power electron bombardment. Aperture 70 has several purposes: to limit the image size of source 10 (by clipping the tails of the electron distribution); to block electrons strongly scattered in the reticle; to create image contrast at the target; and to provide a means to sense beam current for alignment and other corrections. Accordingly, it will be sometimes referred to as a multi-purpose aperture.

A second advantage is the ability to place elements for dynamic correction of aberrations (field curvature, astigmatism, distortion) symmetrically around the fixed pivot point, so that additional aberrations resulting from the scanning motion of the beam are minimized because the beam passes through the corrective elements concentrically.

Lens 40 is also referred to as an immersion lens, in analogy to optical lenses, since the object (the reticle) is immersed in the focussing field defining the lens. Immersion is not required, and both the physical location along the Z-axis and the shape of the fields may be tailored. The reticle is not required to be placed exactly on the symmetry plane of lens 40 as shown in FIG. 1. Since the lower part of lens 40, in conjunction with lens 50, provides the overall demagnification of the system, a different axial position of the reticle may be chosen to optimize the overall system performance. For example, the reticle may be placed upstream and outside the field of lens 40, in which case both sections of lens 40 will act as one lens.

ELECTRICAL AND MECHANICAL SCANNING

The exposure process requires synchronization of 4 independent scanning motions:
1. Electrical beam scan on the reticle
2. Mechanical scan of the reticle
3. Electrical beam scan on the wafer
4. Mechanical scan of the wafer Both electrical scans can be modified to correct for errors of the mechanical scans of reticle and wafer, and also to deliberately deviate from the mechanical scans to minimize overhead times at turn-around points.

In FIG. 1, beam 104 steps over reticle 204 in the X direction illustratively from right to left in the figure (with beam 106 stepping over wafer 224 simultaneously from left to right), while the reticle and wafer are scanned mechanically in the y direction (in and out of the paper plane). The mechanical motion is not interrupted for exposures. Blurring of the image due to motion during exposure is avoided by deflecting the beam during the exposure (referred to as bucking the stage motion) to compensate for the stage motion. The beam may be effectively limited to a small range in the Y dimension, say a few subfield rows, perpendicular to the X-Z plane. There is no need to scan the beam electrically by a large amount in the Y-direction, when a continuously moving stage is used, which accomplishes the result. However, x and y electrical scanning can be combined with a mechanical "step & repeat" motion in order to employ a deflection system having a smaller deflection than that illustrated here.

Figure 2:
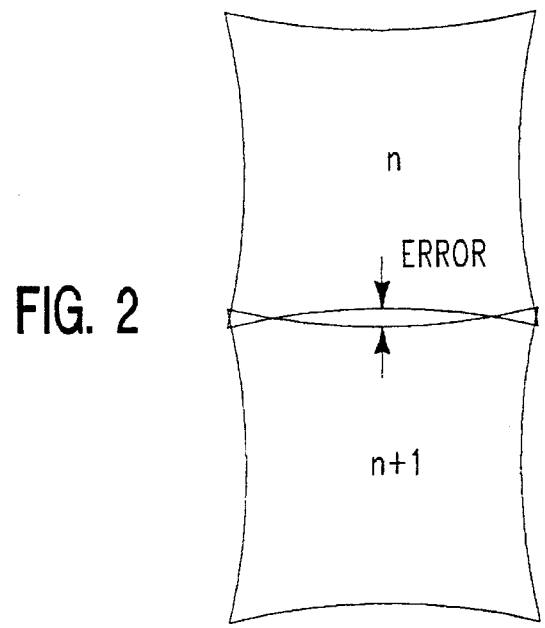
FIG. 2 illustrates an enlarged view of an example of distorted adjacent subfields on the wafer.

Referring now to FIG. 2, there is shown an enlarged portion of a wafer written with the inventive system, showing intersection of two adjacent subfields, n and n+1. Note that lines perpendicular to the edges of the common boundary will connect at the area in the corners because the subfields overlap there, but such lines will not meet in the center of the boundary. Conversely, lines parallel to the boundary may overlap and short out in the overlap region, while such parallel lines will have an extra margin of separation in the center area. Consequently, reticles constructed according to the invention will have an overlap rim extending outside the nominal dimension so that the images overlap when the images are correctly aligned. This overlap will be set empirically to allow for alignment errors of undistorted subfields, for distortion errors of correctly positioned subfields, and for a combination of the two.

Figure 3:
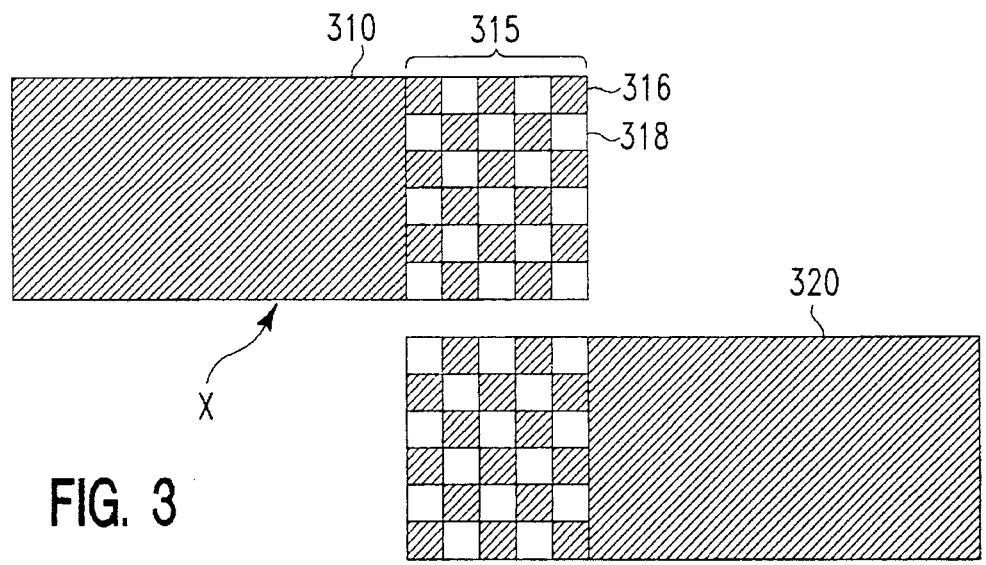

One embodiment of the invention is illustrated in FIG. 3, in which lines 310 and 320 are from portion of adjacent subfields. These lines are meant to align, but are shown displaced in the drawing for greater clarity. The overlap area has a checkerboard pattern in which elements 316 are illustratively opaque and elements 318 are illustratively transparent. Those skilled in the art will appreciate that when the alignment is correct, there will be no overexposure and thus no blooming. When the alignment is off, there will be some double exposure and some underexposure, but the overexposure will be confined to a small area. The intersection of the shaded areas will not be perfect and will be deliberately made with a reasonable thickness for structural reasons. This is a practical advantage, as overlap will increase the misalignment tolerance.

The shaded area in FIG. 3 may be an "opaque" portion of the reticle or a transparent portion, depending on the type of photoresist and the feature being defined. Non-simply connected apertures (the doughnut problem) may be dealt with by the use of supporting struts by the use of complementary masks or by the use of a differential scattering reticle.

In FIGS. 4A and 4B, there is shown an improved checkerboard system, in which the shaded areas are transparent areas 418, with solid or blocking areas 416 shown as unshaded in FIG. 4A. In the example, it is assumed that lines 410 and 420 are the minimum width for that technology. The apertures in the checkerboard pattern have been deliberately made sufficiently oversize by an empirical amount (illustratively ⅓ the width) that will result in that these checkerboard areas print (features below the minimum feature size for a lithography system may print smaller than the reticle image, particularly when the exposure is optical). Thus, when the alignment is correct, there are overlap areas in which there will be some double exposure, depending on a number of tool and process parameters, but they are small, so that some misalignment can be tolerated. The overlap areas are the only ones shaded in FIG. 4B, for clarity in presentation.

Figure 5A:
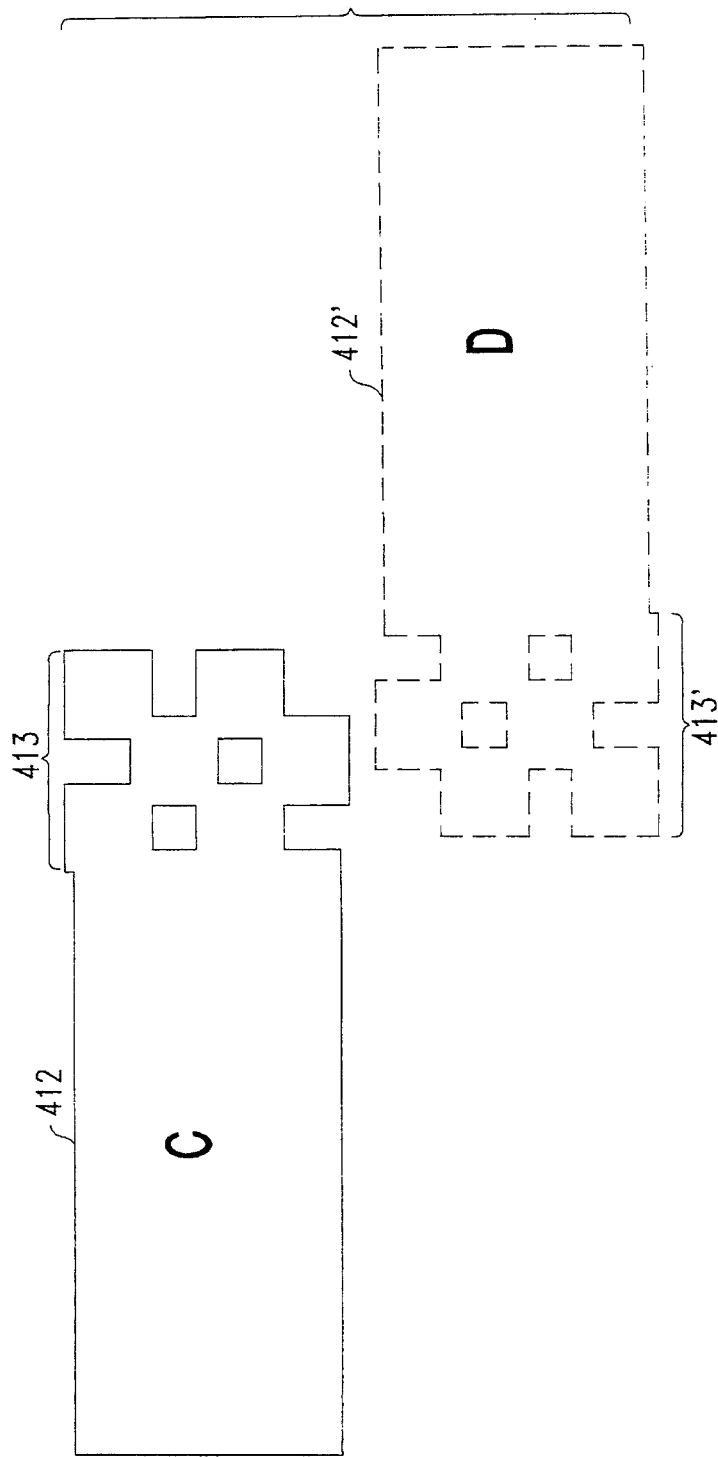
Figure 5C:
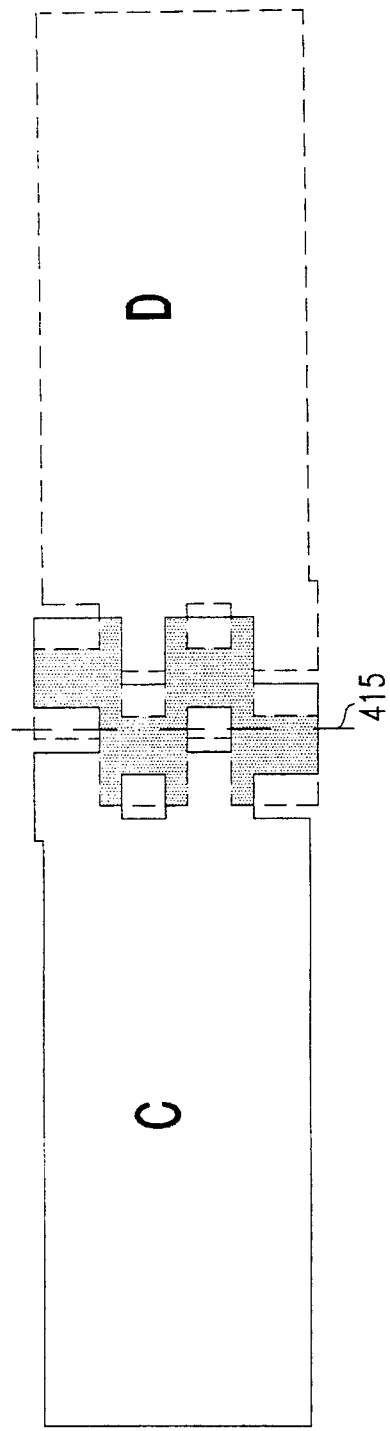

Referring now to FIG. 5A, a pair of lines 412 and 412' are shown that are intended to join at a subfield boundary. They are shown displaced in this figure for clarity. Brackets 413 and 413 indicate a nominal overlap that is designed into the subfields of the reticle. For a nominal alignment error of 20 nm, the subfields should overlap by the distance 413 (illustratively 100 nm) in order to ensure that there are no gaps in connecting lines. Complementary patterned areas having the width of the nominal overlap are formed at the ends of the lines at the boundaries of subfields. In this particular embodiment, the pattern is asymmetric. Note in FIG. 5B that when the lines are correctly aligned, there is a grid of lines (shown as shaded) that have a double exposure, alternating with rectangular areas that have a single exposure. This arrangement has the advantage that "blooming" of the pattern from excessive exposure is reduced well below what it would be if the entire overlap area had a double exposure. Referring now to FIG. 5C, there is shown a case in which there is a longitudinal displacement along the axis of lines 512–512'. It can be seen from the figure that there is still a substantial overlap that is greater than it would be if a simple checkerboard pattern were used.

In prior art stencil reticles, the beam passes through open apertures and is totally absorbed by the "opaque" portions. Unless the reticles are extremely thick, some electrons will pass through the nominal thickness because scattering of electrons is characterized by extensive straggling. Total absorption may be ensured by the use of extremely thick reticles, but at the cost of scattering on the walls of apertures and difficulty in supporting the greater mass. In scattering reticles, contrast is provided by discriminating electrons scattered in high-Z thick areas and from those scattered in low-Z thin areas. There is always considerable scattering from the thin areas because there is a minimum thickness that is required for strength, so that conventional scattering reticles suffer from low contrast compared with stencil reticles. Stencil reticles and scattering reticles represent two extremes of reticle design. The former suffers from problems associated with the heat load on the reticle. The latter suffers from a substantial loss of current at the control aperture even from the "transparent" areas (sometimes referred to herein as "passage" areas) of the reticle and will also have heat problems because there will be substantial deposition of energy in the high-Z areas of the reticle. The invention can also be used with a reticle constructed according to the principles of copending patent application Ser. No. 08/173, 304, in which the pattern is formed by apertures in a thin layer having a thickness such that a substantial number (90%, say) of 100 KeV electrons are scattered far enough to be intercepted by a contrast aperture. For Si, this thickness is approximately 0.05 μm.

For convenience in the claims, the term "hindering" and variations thereof will be used as a generic term to cover absorbing radiation (electrons, ions, or photons) and also scattering radiation (both elastic and inelastic scattering). The term "resistance to radiation" will be used as a generic term to cover both thickness and atomic number. As those skilled in the art know, scattering increases as the material becomes thicker and as a material having a lower atomic number is replaced by a material having a higher atomic number.

Figure 6:
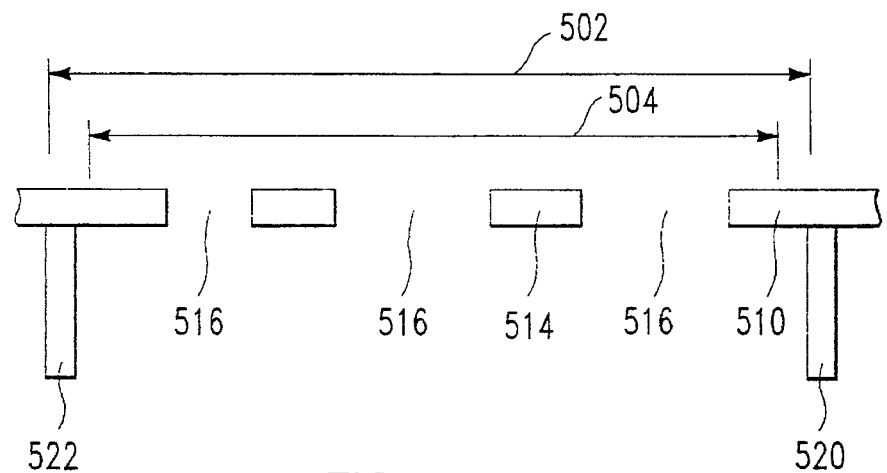
FIG. 6 illustrates a cross section of a reticle suitable for use with the invention.

In FIG. 6, there is illustrated in cross section a sample reticle constructed according to the invention. Layer 610 is the main material of the reticle, illustratively Silicon. The thickness of layer 610 depends on whether the reticle operates on the absorbing or differential scattering principle, as the invention will work with all forms of reticle. Struts 620 and 622 bracket the subfield illustrated. These struts are separated by a nominal distance indicated by the arrow labelled 602. The nominal usable dimension of the subfield is indicated by the arrow labelled 604 and is 1 mm in this example. Struts 620 have a nominal width of about 0.2 mm and the thickness of the original wafer (about 0.5 mm). They may be fabricated by conventional etching techniques, e.g. by a preferential backside etch. Aperture 618, represented here in the more common situation of a singly-connected area, is an opening in layer 610. More complex geometries may be handled by any of the conventional techniques.

RETICLE PRE-DISTORTION

To compensate for deflection distortions of the system, the pattern of the reticle can be laid down pre-distorted in the opposite direction, provided of course, that the system distortions are known and invariant. For example, in the case of residual barrel distortion in the optical system, the reticle would be pin-cushion shaped in the proper amount varying from subfield to subfield. However, no severe constraints would have to be placed on the allowable distortion regarding symmetry or polynomial order. Even non-linear distortions within a sub-field could thus be dealt with. Repetitive thermal distortion of the mask under beam irradiation can be corrected as well as reducing the requirements for global thermal distortion.

Although the invention has been illustrated with respect to an electron beam system, it may also be used with photon, X-ray, or ion beam systems. For example, the reticle need not be binary and a combination of full and partial exposures may be used to pattern the beam. These reticles would have clear (transmissive) areas, opaque (non-transmissive) areas, and partially transmissive areas to obtain the fractional (e.g. ½) dose required by the overlapping features at the boundaries. For example, the embodiment of FIG. 3 may be used with the checkerboard area replaced by a uniform area of partially transmissive material (transmitting half the radiation, for example). The mask making process will be more complex, but there will be the benefit of improved stitching. The term "radiation modulation pattern" will be used as a general description covering both binary and non-binary reticles and also covering reticles that pattern the beam by absorbing incident radiation and those that pattern the beam by scattering the incident radiation.

Those skilled in the art will readily be able to devise other embodiments of the invention than that illustrated and the scope of the following claims is not meant to be limited to the embodiments shown.

I claim:

1. A reticle for patterning an incident beam of charged particle radiation comprising:

a base layer of a base thickness and containing a reticle pattern; and a set of reinforcing struts connected to said base layer on a first side thereof for separating said base layer into a set of non-contiguous subfields, characterized in that;

said pattern is carried by a set of elements in said base layer; each subfield is surrounded by a boundary which comprises an overlap rim;

those of said elements of said set of non-contiguous subfields that come within an overlap rim of a boundary are patterned with a radiation modulation pattern including radiation-hindering areas and apertures for permitting the unhindered passage of radiation that provides for desired exposure when said elements are correctly aligned;

said radiation modulation pattern in a first subset of said set of non-contiguous subfields comprises a set of alternating radiation-hindering areas and a set of apertures in which said radiation-hindering areas have areas substantially greater than said set of apertures;

those of said elements in an overlap rim of a second subset of said set of non-contiguous subfields have a complementary radiation modulation pattern comprising a set of alternating radiation-hindering areas and a set of apertures in which said radiation-hindering areas have areas substantially greater than said set of apertures and in which complementary pattern said radiation-hindering areas are disposed such that the image of said set of apertures from said radiation modulation pattern is aligned with the image of said radiation-hindering areas from said complementary radiation modulation pattern when the images of said element and said complementary element are aligned to form the desired pattern.

2. A reticle for patterning an incident beam of radiation comprising:

a base layer of a base thickness and containing a reticle pattern; and a set of reinforcing struts connected to said base layer on a first side thereof for separating said base layer into a set of non-contiguous subfields, characterized in that;

said pattern is carried by a set of elements in said base layer; each subfield is surrounded by a boundary which comprises an overlap rim; and those of said elements of said set of non-contiguous subfields that come within an overlap rim of a boundary are patterned with a radiation modulation pattern including radiation-hindering areas having a first degree of resistance to radiation and a set of passage areas for permitting the passage of radiation with less hindrance that provides for desired exposure when said elements are correctly aligned;

said radiation modulation pattern in a first subset of said set of non-contiguous subfields comprises a set of alternating radiation-hindering areas and a set of passage areas in which said radiation-hindering areas have areas substantially greater than said set of passage areas;

those of said elements in an overlap rim of a second subset of said set of non-contiguous subfields have a complementary radiation modulation pattern comprising a set of alternating radiation-hindering areas and a set of passage areas in which said radiation-hindering areas have areas substantially greater than said set of passage areas and in which complementary pattern said radiation-hindering areas are disposed such that the image of said set of passage areas from said radiation modulation pattern is aligned with the image of said radiation-hindering areas from said complementary radiation modulation pattern when the images of said element and said complementary element are aligned to form the desired pattern.

3. A reticle for patterning an incident beam of radiation comprising:

a base layer of a base thickness and containing a reticle pattern with a set of subfields, characterized in that;

said pattern is carried by a set of elements in said base layer; each subfield is surrounded by a boundary which comprises an overlap rim; and those of said elements that come within an overlap rim of a subfield are patterned with an radiation modulation pattern including radiation-hindering areas and apertures for permitting the unhindered passage of radiation that provides for desired exposure when said elements are correctly aligned;

said radiation modulation pattern in a first subset of said set of non-contiguous subfields comprises a set of alternating radiation-hindering areas and a set of apertures in which said radiation-hindering areas have areas substantially greater than said set of apertures;

those of said elements in an overlap rim of a second subset of said set of non-contiguous subfields have a complementary radiation modulation pattern comprising a set of alternating radiation-hindering areas and a set of apertures in which said radiation-hindering areas have areas substantially greater than said set of apertures and in which complementary pattern said radiation-hindering areas are disposed such that the image of said set of apertures from said radiation modulation pattern is aligned with the image of said radiation-hindering areas from said complementary radiation modulation pattern when the images of said element and said complementary element are aligned to form the desired pattern.

4. A reticle for patterning an incident beam of radiation comprising:

a base layer of a base thickness and containing a reticle pattern; and a set of reinforcing struts connected to said base layer on a first side thereof for separating said base layer into a set of non-contigugus subfields, characterized in that;

said pattern is carried by a set of elements in said base layer; each subfield is surrounded by a boundary which comprises an overlap rim; and those of said elements of said set of non-contiguous subfields that come within an overlap rim of a boundary are patterned with a radiation modulation pattern including radiation-hindering areas having a first degree of resistance to radiation and a set of passage areas for permitting the passage of radiation with less hindrance that provides for desired exposure when said elements are correctly aligned;

said radiation modulation pattern in a first subset of said set of non-contiguous subfields comprises a set of alternating radiation-hindering areas and a set of passage areas in which said radiation-hindering areas have areas substantially greater than said set of passage areas;

those of said elements in an overlap rim of a second subset of said set of non-contiguous subfields have a complementary radiation modulation pattern comprising a set of alternating radiation-hindering areas and a set of passage areas in which said radiation-hindering areas have areas substantially greater than said set of passage areas and in which complementary pattern said radiation-hindering areas are disposed such that the image of said set of passage areas from said radiation modulation pattern is aligned with the image of said radiation-hindering areas from said complementary radiation modulation pattern when the images of said element and said complementary element are aligned to form the desired pattern.

5. A reticle for patterning an incident beam of radiation comprising: a base layer of a base thickness and containing a reticle pattern with a set of non-contiguous subfields, characterized in that;

said pattern is carried by a set of elements in said base layer; each subfield is surrounded by a boundary which comprises an overlap rim; and those of said elements that come within an overlap rim of a subfield are patterned with an radiation modulation pattern that provides for desired exposure when said elements are correctly aligned;

said radiation modulation pattern in a first subset of said set of non-contiguous subfields comprises a set of alternating radiation-hindering areas and a set of apertures for permitting the unhindered passage of radiation in which said radiation-hindering areas have areas substantially greater than said set of apertures;

those of said elements in an overlap rim of a second subset of said set of non-contiguous subfields have a complementary radiation modulation pattern comprising a set of alternating radiation-hindering areas and a set of apertures in which said radiation-hindering areas have areas substantially greater than said set of apertures and in which complementary pattern said radiation-hindering areas are disposed such that the image of said set of apertures from said radiation modulation pattern is aligned with the image of said radiation-hindering areas from said complementary radiation modulation pattern when the images of said element and said complementary element are aligned to form the desired pattern.

6. A reticle for patterning an incident beam of radiation comprising:

a base layer of a base thickness and containing a reticle pattern with a set of non-contiguous subfields, characterized in that;

said pattern is carried by a set of elements in said base layer; each subfield is surrounded by a boundary which comprises an overlap rim; and those of said elements that come within an overlap rim of a subfield are patterned with an radiation modulation pattern including radiation-hindering areas having a first degree of resistance to radiation and a set of passage areas for permitting the passage of radiation with less hindrance that provides for desired exposure when said elements are correctly aligned;

said radiation modulation pattern in a first subset of said set of non-contiguous subfields comprises a set of alternating radiation-hindering areas and a set of passage areas in which said radiation-hindering areas have areas substantially greater than said set of passage areas;

those of said elements in an overlap rim of a second subset of said set of non-contiguous subfields have a complementary radiation modulation pattern comprising a set of alternating radiation-hindering areas and a set of passage areas in which said radiation-hindering areas have areas substantially greater than said set of passage areas and in which complementary pattern said radiation-hindering areas are disposed such that the image of said set of passage areas from said radiation modulation pattern is aligned with the image of said radiation-hindering areas from said complementary radiation modulation pattern when the images of said element and said complementary element are aligned to form the desired pattern.

* * * * *